United States Patent [19]
Morton et al.

[11] Patent Number: 5,365,121
[45] Date of Patent: Nov. 15, 1994

[54] CHARGE PUMP WITH CONTROLLED RAMP RATE

[75] Inventors: Bruce L. Morton, Austin; David W. Chrudimsky, Round Rock, both of Tex.

[73] Assignee: Motorola Inc., Schaumburg, Ill.

[21] Appl. No.: 28,006

[22] Filed: Mar. 8, 1993

[51] Int. Cl.⁵ .............................................. H03G 11/00
[52] U.S. Cl. ..................... 327/170; 327/291; 327/536
[58] Field of Search ............... 307/264, 246, 296.2, 307/607, 268

[56] References Cited

U.S. PATENT DOCUMENTS

| | | | |
|---|---|---|---|
| 4,326,134 | 4/1982 | Owen et al. | 307/268 |
| 5,111,064 | 5/1992 | Ward | 307/270 |
| 5,119,339 | 6/1992 | Heusler | 365/226 |
| 5,138,190 | 8/1992 | Yamazaki et al. | 307/296.5 |

OTHER PUBLICATIONS

Duane Oto et al., "High-Voltage Regulation and Process Considerations for High-Density 5V-Only E2-PROM's", IEEE Journal of Solid-State Circuits, vol. SC-18, No. 5, Oct. 1983, pp. 532-538.

Primary Examiner—William L. Sikes
Assistant Examiner—Fetsum Abraham
Attorney, Agent, or Firm—Daniel D. Hill

[57] ABSTRACT

A charge pump with controlled ramp rate (200) includes a charge pump (65), an RC differentiator circuit (258), and a trigger circuit (238). The charge pump (65) receives a clock signal and provides a high output voltage for programming and erasing an EEPROM. The RC differentiator circuit (258) provides a control voltage that is proportional to the ramp-up rate of the high output voltage. The trigger circuit (238) receives the control voltage, and provides a control signal to disable the charge pump (65) if the ramp-up rate exceeds a predetermined rate. When the ramp-up rate falls below the predetermined rate, the trigger circuit (238) provides a control signal to enable the charge pump (65). The trigger circuit (238) has hysteresis to regulate its switching point. Controlling the ramp-up rate of the output voltage reduces the peak tunneling current in the EEPROM cell to increase reliability.

18 Claims, 6 Drawing Sheets

CHARGE PUMP WITH CONTROLLED RAMP RATE

FIELD OF THE INVENTION

This invention relates generally to charge pumps, and more particularly to a charge pump with controlled ramp rate.

BACKGROUND OF THE INVENTION

An Electrically Erasable Programmable Read Only Memory (EEPROM) is a type of nonvolatile memory that is reprogrammable. EEPROM cells are arranged in an array and located at the intersections of rows and columns. An EEPROM cell is generally comprised of a floating gate transistor and a select transistor. The floating-gate transistor can be programmed by grounding the control electrode and raising the drain voltage. Tunneling causes electrons to be transferred from the substrate to the floating-gate through a thin tunneling oxide layer. A programming voltage pulse as high as 18–20 volts may be needed to induce tunneling. As charge builds up on the floating-gate, the electric field is reduced, decreasing electron flow. During programming, the select transistor is used to isolate the unselected EEPROM cells that are located on the same column. Erasing of the EEPROM cell is accomplished by applying a high programming voltage pulse to the control electrode of the floating-gate transistor.

An EEPROM is limited in the number of programming cycles it can experience before failure due to overstress. The overstress is caused by the high programming voltage pulses. The peak tunneling current has a direct bearing on EEPROM reliability and service life, and is related to the ramp-up rate of the programming voltage pulse. If the ramp-up rate of the programming voltage pulse is too high, the peak tunneling current may overstress the thin tunneling oxide layer, resulting in reduced reliability and shortened service life.

Typically, a charge pump, located on the same integrated circuit as the EEPROM array is used to generate the programming voltage pulses. The charge pump usually includes a plurality of series-connected pump stages that are driven by two nonoverlapping clock signals. The series-connected pump stages multiply the amplitude of the clock signals. The actual voltage obtained at the charge pump output terminal depends on the number of pump stages and on the charge transfer efficiency of the pump stages. In addition to providing a programming voltage pulse to the EEPROM cells, the charge pump may also be used to support decoding. Therefore, the charge pump is subjected to varying load conditions that may affect the ramp-up rate of the programming voltage pulse. Under heavy loading, the ramp-up rate may be relatively slow. If the load is suddenly reduced, the ramp-up rate may increase dramatically, overstressing the tunneling oxide layer of the floating-gate transistor.

SUMMARY OF THE INVENTION

Accordingly, there is provided, in one form, a charge pump with controlled ramp rate comprising a charge pump, an RC differentiator circuit, and a trigger circuit. The charge pump receives a clock signal, and in response, provides an output voltage having a magnitude greater than a magnitude of the clock signal. The RC differentiator circuit is coupled to the charge pump, and in response to receiving the output voltage, the RC differentiator provides a control voltage proportional to a ramp-up rate of the output voltage.

The trigger circuit is coupled to the RC differentiator circuit and receives the control voltage. In response to the control voltage increasing above a predetermined switching point, the trigger circuit provides a first control signal to disable the charge pump. In response to the control voltage decreasing below the predetermined switching point, the trigger circuit provides a second control signal to enable the charge pump. These and other features and advantages will be more clearly understood from the following detailed description taken in conjunction with the accompanying drawings.

DESCRIPTION OF A PREFERRED EMBODIMENT

Figure 1:
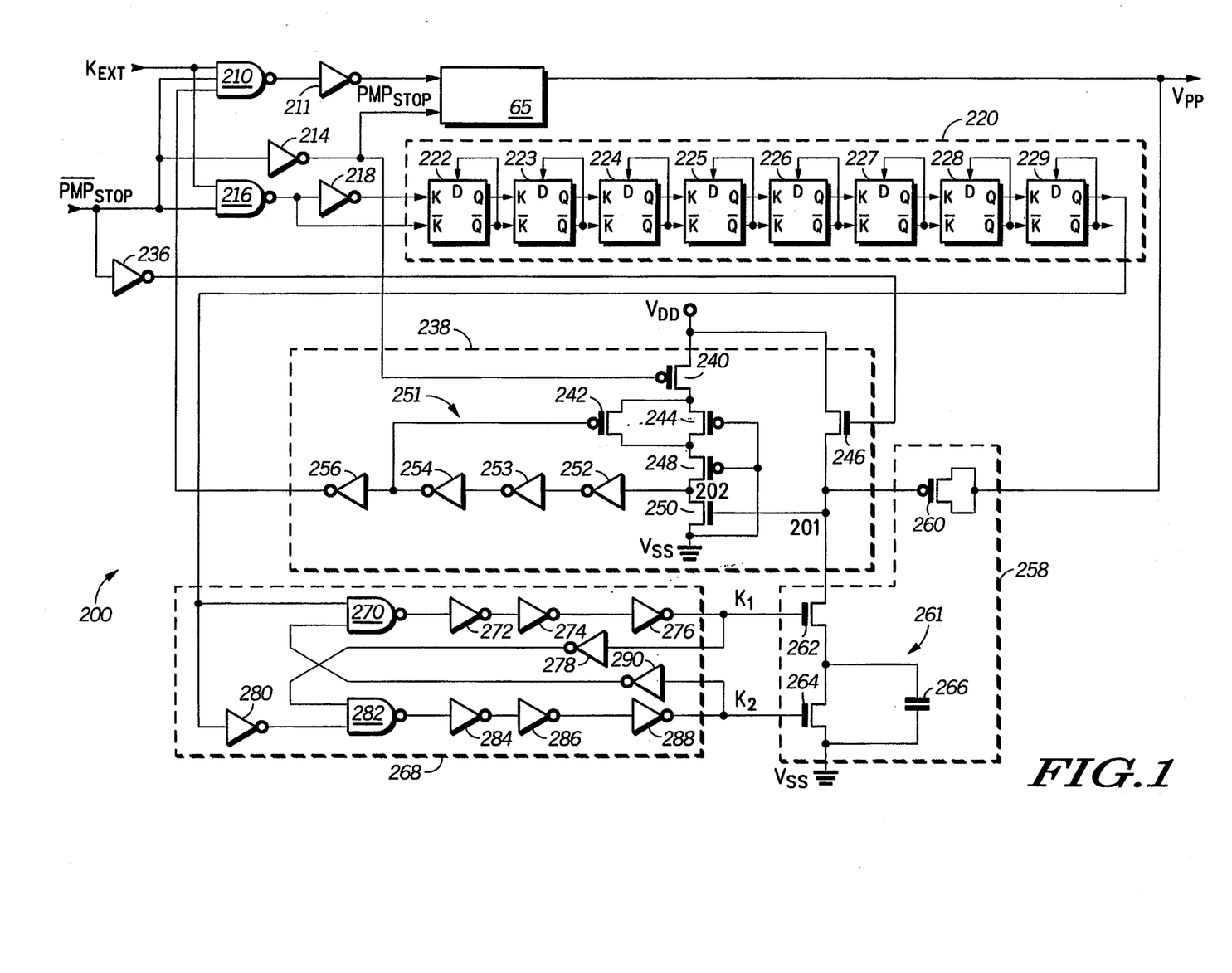
FIG. 1 illustrates in partial logic diagram form and partial schematic diagram form a charge pump with controlled ramp rate in accordance with the present invention.

FIG. 1 illustrates in partial logic diagram form and partial schematic diagram form charge pump with controlled ramp rate 200 in accordance with the present invention. Charge pump with controlled ramp rate 200 includes NAND logic gates 210 and 216, inverters 211, 214, 218, and 236, charge pump 65, frequency divider circuit 220, trigger circuit 238, RC differentiator circuit 258, and clock control logic circuit 268. Frequency divider circuit 220 includes series-connected D-type flip-flops 222–229. Trigger circuit 238 includes P-channel transistors 240, 242, 244, and 248, N-channel transistors 246 and 250, and buffer/inverter circuit 251. Buffer/inverter circuit 251 includes inverters 252, 253, 254, and 256. RC differentiator circuit 258 includes MOS (metal-oxide semiconductor) capacitor 260 and switched capacitor 261. Switched capacitor 261 includes N-channel transistors 262 and 264, and capacitor 266. Clock control logic circuit 268 includes NAND logic gates 270 and 282, and inverters 272, 274, 276, 278, 280, 284, 286, 288, and 290.

NAND logic gate 210 has a first input terminal for receiving an external clock signal labeled "$K_{EXT}$", a second input terminal, a third input terminal, and an output terminal. Inverter 211 has an input terminal connected to the output terminal of NAND logic gate 210, and an output terminal. Charge pump 65 has a first input terminal connected to the output terminal of inverter 211, a second input terminal, and an output terminal for providing an output voltage labeled "$V_{PP}$". Inverter 214 has an input terminal connected to the second input terminal of NAND logic gate 210, and a output terminal connected to the second input terminal of charge pump 65. NAND logic gate 216 has a first input terminal connected to the first input terminal of NAND logic gate 210, a second input terminal for receiving a pump stop signal labeled "$\overline{PMP}_{STOP}$", and an output terminal. Inverter 218 has an input terminal connected to the output terminal of NAND logic gate 216, and an output terminal. D-type flip-flops 222–229 each have an input terminal labeled "D", clock input terminals labeled "K" and "$\overline{K}$", and output terminals labeled "Q" and "$\overline{Q}$". D-type flip-flop 222 has clock terminal K connected to the output terminal of inverter 218, and clock terminal $\overline{K}$ connected to the output terminal of NAND logic gate 216. Note that a bar over a signal name or terminal name indicates that the signal or terminal is a logical complement of a signal or terminal having the same name but lacking the bar. Each of flip-flops 222–229 have output terminal $\overline{Q}$ connected to input terminal D. Flip-flop 222 has output terminal Q connected to clock terminal K of flip-flop 223, flip-flop 223 has output terminal Q connected to clock terminal K of flip-flop 224, and so on. Flip-flop 222 has output terminal $\overline{Q}$ connected to clock terminal $\overline{K}$ of flip-flop 223, flip-flop 223 has output terminal $\overline{Q}$ connected to clock terminal $\overline{K}$ of flip-flop 224, and so on. Inverter 236 has an input terminal connected to the second input terminal of NAND logic gate 216, and an output terminal.

N-channel transistor 246 of trigger circuit 238 has a drain connected to a positive power supply voltage terminal labeled "$V_{DD}$", a gate connected to the output terminal of inverter 236, and a source connected to node 201. P-channel transistor 240 has a source connected to $V_{DD}$, a gate connected to the output terminal of inverter 214, and a drain. P-channel transistor 242 has a source connected to the drain of P-channel transistor 240, a gate, and a drain. P-channel transistor 244 has a source connected to the drain of P-channel transistor 240, a gate connected to a negative power supply voltage terminal labeled "$V_{SS}$", and a drain connected to the drain of P-channel transistor 242. P-channel transistor 248 has a source connected to the drains of P-channel transistors 242 and 244, a gate connected to $V_{SS}$, and a drain connected to node 202. N-channel transistor 250 has a drain connected to the drain of P-channel transistor 248 at node 202, a gate connected to the source of N-channel transistor 246 at node 201, and a source connected to $V_{SS}$. Inverter 252 has an input terminal connected to the drain of P-channel transistor 248, and an output terminal. Inverter 253 has an input terminal connected to the output terminal of inverter 252, and an output terminal. Inverter 254 has an input terminal connected to the output terminal of inverter 253, and an output terminal. Inverter 256 has an input terminal connected to the output terminal of inverter 254, and an output terminal connected to the third input terminal of NAND logic gate 210.

MOS capacitor 260 of RC differentiator circuit 258 has a first terminal connected to the output terminal of charge pump 65 for receiving output voltage $V_{PP}$, and a second terminal connected to the source of N-channel transistor 246 at node 201. N-channel transistor 262 has a drain connected to the source of N-channel transistor 246 at node 201, a gate, and a source. N-channel transistor 264 has a drain connected to the source of N-channel transistor 262, a gate, and a source connected to $V_{SS}$. Capacitor 266 has a first terminal connected to the drain of N-channel transistor 264, and a second terminal connected to the source of N-channel transistor 264.

NAND logic gate 270 of clock control logic 268 has a first input terminal connected to output terminal Q of flip-flop 229, a second input terminal, and an output terminal. Inverter 272 has an input terminal connected to the output terminal of NAND logic gate 270, and an output terminal. Inverter 274 has an input terminal connected to the output terminal of inverter 272, and an output terminal. Inverter 276 has an input terminal connected to the output terminal of inverter 274, and an output terminal connected to the gate of N-channel transistor 262 for providing clock signal $K_1$. Inverter 278 has an input terminal connected to the output terminal of inverter 276, and an output terminal. Inverter 280 has an input terminal connected to the first input terminal of NAND logic gate 270, and an output terminal. NAND logic gate 282 has a first input terminal connected to the output terminal of inverter 278, a second input terminal connected to the output terminal of inverter 280, and an output terminal. Inverter 284 has an input terminal connected to the output terminal of NAND logic gate 282, and an output terminal. Inverter 286 has an input terminal connected to the output terminal of inverter 284, and an output terminal. Inverter 288 has an input terminal connected to the output terminal of inverter 286, and an output terminal connected to the gate of N-channel transistor 264 for providing clock signal $K_2$. Inverter 290 has an input terminal connected to the output terminal of inverter 288, and an output terminal connected to the second input terminal of NAND logic gate 270.

Figure 2:
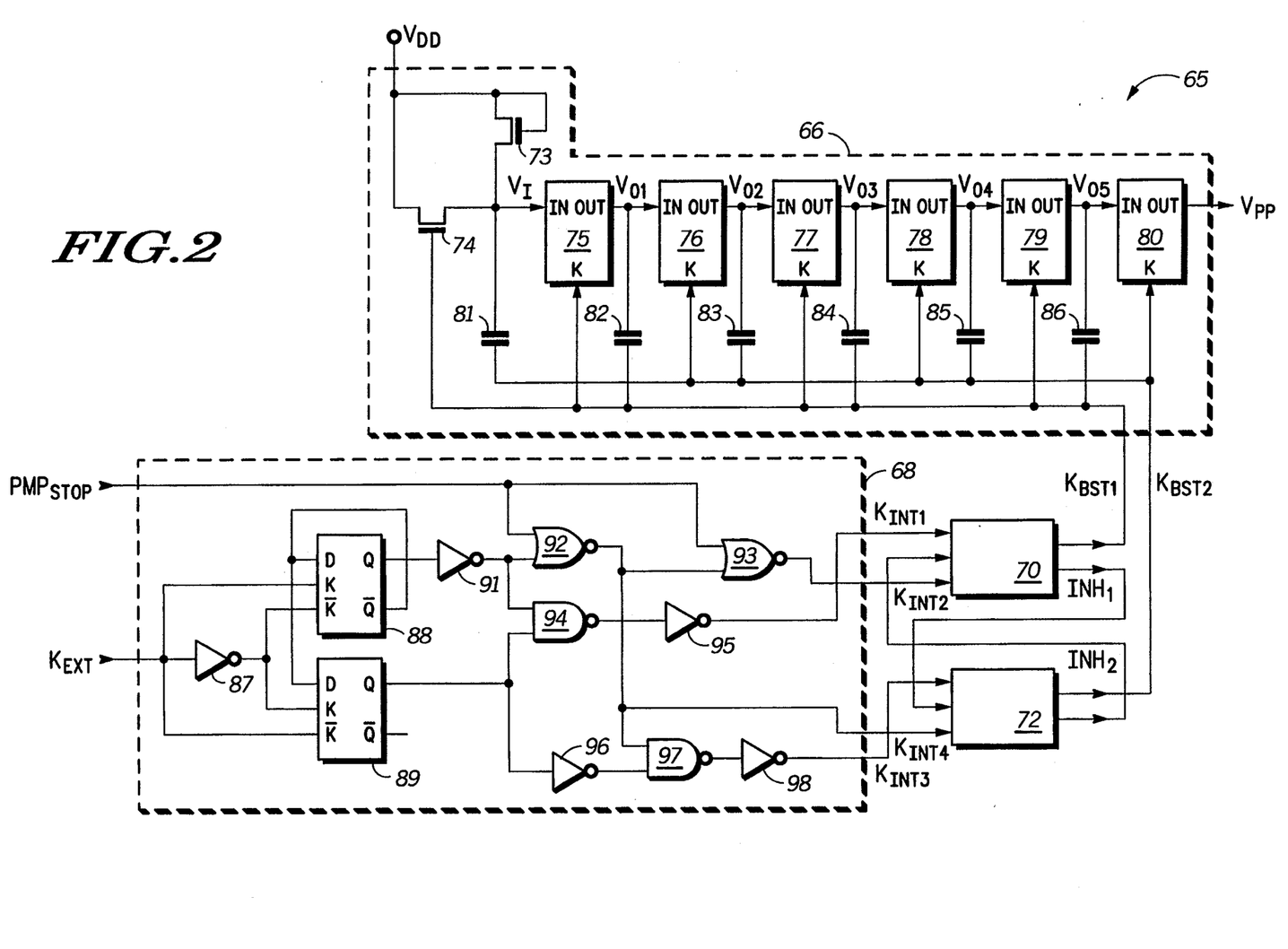
FIG. 2 illustrates in partial block diagram form, partial schematic diagram form, and partial logic diagram form a charge pump in accordance with the present invention.

Charge pump with controlled ramp rate 200 is enabled to provide output voltage $V_{PP}$ when pump stop signal $\overline{PMP}_{STOP}$ is a logic high. External clock signal $K_{EXT}$ is provided to charge pump 65 through NAND logic gate 210 and inverter 211. A preferred embodiment of charge pump 65 is illustrated in FIG. 2. However, charge pump 65 may be any type of high voltage charge pump that is capable of producing an output voltage $V_{PP}$ having a magnitude of about 18–20 volts. The ramp-up rate of output voltage $V_{PP}$ is controlled by RC differentiator 258. RC differentiator 258 and trigger circuit 238 receives output voltage $V_{PP}$ and provides a feedback control signal to disable charge pump 65 if the actual ramp-up rate exceeds the predetermined ramp-up rate. Hysteresis is used to determined the voltage between which charge pump 65 stops pumping charge and starts pumping charge. In addition, hysteresis is used to limit the effects of noise and other transient signals. Controlling the ramp-up rate of output voltage $V_{PP}$ provides the advantage of reducing the peak tunneling current during the reprogramming of an EEPROM cell. By reducing the peak tunneling current during programming, overstress of the EEPROM cells is avoided, thus increasing reliability of the EEPROM.

RC differentiator 258 and trigger circuit 238 limits the ramp-up rate of output voltage $V_{PP}$ to a predetermined ramp-up rate. In a preferred embodiment, the predetermined ramp-up rate is about 35,000 volts per second. The ramp-up rate, or rise time, can be adjusted by changing the RC time constant. The "C", or capacitance of RC differentiator 258 is provided by MOS capacitor 260. In a preferred embodiment, MOS capacitor 260 is a P-channel transistor having its drain and source terminals connected together to provide the first terminal, and the gate provides the second terminal. In other embodiments, other types of capacitors can be used. The "R", or resistance of RC differentiator 258 is provided by switched capacitor 261. Switched capacitor 261 receives nonoverlapping clock signals at the gates of N-channel transistors 262 and 264. N-channel transistors 262 and 264 function as switches to alternately connect capacitor 266 to ground and to node 201. The RC time constant is about 600 microseconds. However, the time constant can be changed by changing the frequency of clock signals $K_1$ and $K_2$, or by changing the capacitance of capacitor 266 or capacitor 260. The effective resistance of switched capacitor 261 in a preferred embodiment is about 20 megaohms. In other embodiments, other means for providing the resistance for RC differentiator 238 are possible, such as a large valued resistor, or a MOS transistor. However, a large valued resistor would require substantially more surface area on an integrated circuit than a switched capacitor. Also, the capacitance of capacitor 266 is more easily controlled than the resistance of a large valued resistor, or of a MOS transistor.

Frequency divider circuit 220 receives a logic high signal from the output terminal of inverter 218 at input terminal D of each of flip-flops 222–229. Frequency divider circuit 220 is a conventional frequency divider and provides a clock signal at output terminal Q of flip-flop 229 having a frequency that is on the order of $2^8$ lower than the frequency of external clock signal $K_{EXT}$, since there are eight D-type flip-flops connected in series. The frequency of the clock signal provided at output terminal Q of flip-flop 229 may be adjusted up or down by decreasing or increasing, respectively, the number of flip-flops in frequency divider 220. External clock signal $K_{EXT}$ may be provided by the system clock, or by a separate oscillator circuit.

RC differentiator 258 provides a control voltage at output node 201 that is proportional to the ramp-up rate of output voltage $V_{PP}$. The voltage at node 201 can be expressed as $$V_{201} = RC(dV_{PP}/dt)$$

where $V_{201}$ represents the control voltage at node 201, R represents the resistance of switched capacitor 261, and C represents the capacitance of capacitor 260. Therefore, the control voltage at node 201 is proportional to the rate of change of output voltage $V_{PP}$, and is received by trigger circuit 238, which has a predetermined fixed switch point with hysteresis. The hysteresis is provided by a feedback path between the output terminal of inverter 254 and the gate of P-channel transistor 242. The hysteresis voltage in a preferred embodiment is about 200 millivolts.

In operation, when the control voltage at node 201 is below the switching point of N-channel transistor 250, indicating that the ramp-up rate of output voltage $V_{PP}$ is less than the predetermined rate, N-channel transistor 250 is substantially non-conductive. The voltage at node 202 is a logic high voltage, and trigger circuit 238 provides a logic high control signal to the third input terminal of NAND logic gate 210 to enable, or activate charge pump 65. P-channel transistors 244 and 248 provide relatively weak passive loads, and P-channel transistor 242 provides the hysteresis of trigger circuit 238. When the voltage at node 202 is a logic high, the voltage at the output terminal of inverter 254 is a logic low. P-channel transistor 242 is conductive, which decreases the voltage drop across P-channel transistors 242, 244, and 248. This further increases the voltage at node 202, making trigger circuit 238 more resistant to transients and noise, and effectively causing the fixed switch point of trigger circuit 238 to change by about plus or minus 100 millivolts. The voltage at node 201 has a relatively small voltage swing and is substantially centered at the threshold voltage of N-channel transistor 250. Inverters 252, 253, 254, and 256 function as buffers to ensure that there is adequate voltage swing to reliably activate and deactivate charge pump 65.

The ramp-up rate of output voltage $V_{PP}$ may increase if the load is reduced. If the ramp-up rate of output voltage $V_{PP}$ increases above the predetermined ramp-up rate, the control voltage at node 201 increases above the switching point of N-channel transistor 250. N-channel transistor 250 becomes conductive, resulting in a logic low voltage being provided to the input terminal of inverter 252 at node 202. Trigger circuit 238 provides a logic low control signal to the third input terminal of NAND logic gate 210 to disable, or deactivate charge pump 65 until the ramp-up rate of output voltage $V_{PP}$ decreases below the predetermined ramp-up rate. The voltage at the output terminal of inverter 254 is a logic high voltage, causing P-channel transistor 242 to become substantially non-conductive. This increases the voltage drop across P-channel transistors 242, 244, and 248, thus further decreasing the voltage at node 202 to ensure that the voltage at node 202 remains low. Trigger circuit 238 can be almost any type of trigger circuit, such as a Schmitt trigger.

P-channel transistor 240 provides an enable function for trigger circuit 238, and is conductive when pump stop signal $\overline{PMP_{STOP}}$ is a logic high. When $\overline{PMP_{STOP}}$ is a logic low, charge pump with controlled ramp rate 200 is disabled. Output voltage $V_{PP}$ is reduced to substantially $V_{DD}$. P-channel transistor 240 is substantially non-conductive and prevents DC current through trigger circuit 238 to reduce power consumption when charge pump with controlled ramp rate 200 is disabled. N-channel transistor 246 becomes conductive to prevent a possible "latch-up" condition due to injection at the drains of N-channel transistors 262 and 264.

FIG. 2 illustrates in partial block diagram form, partial schematic diagram form, and partial logic diagram form, charge pump 65 in accordance with the present invention. Charge pump 65 includes series connected pump stages 66, predriver logic circuit 68, and pump driver circuits 70 and 72. Pump driver circuit 70 provides a boosted clock signal labeled "$K_{BST1}$" to series connected pump stages 66. Pump driver circuit 72 provides a boosted clock signal labeled "$K_{BST2}$" to series connected pump stages 66. Series connected pump stages 66 includes N-channel transistors 73 and 74, pump stages 75–80, and capacitors 81–86. Predriver logic 68 includes inverters 87, 91, 95, and 96, flip-flops 88 and 89, NOR logic gates 92 and 93, and NAND logic gates 94 and 97. In the preferred embodiment, all of the N-channel and P-channel transistors are MOS (metal-oxide semiconductor) transistors.

In series connected pump stages 66, N-channel transistor 73 has a gate and a drain connected to a power supply voltage terminal labeled "$V_{DD}$", and a source. N-channel transistor 74 has a drain connected to $V_{DD}$, a source connected to the drain of N-channel transistor 73, and a gate. N-channel transistors 73 and 74 serve as a first pump stage for series connected pump stages 66. Each of pump stages 75–80 has an input terminal labeled "IN", an output terminal labeled "OUT", and a clock terminal labeled "K". The input terminal IN of pump stage 75 is connected to the sources of N-channel transistors 73 and 74 for receiving an input voltage labeled $V_I$, the output terminal OUT of pump stage 75 provides a voltage labeled "$V_{O1}$" to an input terminal IN of pump stage 76. An output terminal OUT of pump stage 76 provides a voltage labeled "$V_{O2}$" to an input terminal IN of pump stage 77, and so on. An output terminal OUT of pump stage 80 provides a boosted output voltage labeled "$V_{PP}$". Each of pump stages 75–80 are the same as prior art pump stage 55 of FIG. 2.

Capacitor 81 has a first terminal connected to the drains of N-channel transistors 73 and 74, and a second terminal for receiving boosted clock signal $K_{BST2}$. Capacitor 82 has a first terminal connected to the input terminal IN of pump stage 76, and a second terminal for receiving boosted clock signal $K_{BST1}$. Capacitor 83 has a first terminal connected to the input terminal IN of pump stage 77, and a second terminal for receiving boosted clock signal $K_{BST2}$. Capacitor 84 has a first terminal connected to the input terminal IN of pump stage 78, and a second terminal for receiving boosted clock signal $K_{BST1}$. Capacitor 85 has a first terminal connected to the input terminal IN of pump stage 79, and a second terminal for receiving boosted clock signal $K_{BST2}$. Capacitor 86 has a first terminal connected to the input terminal IN of pump stage 80, and a second terminal for receiving boosted clock signal $K_{BST1}$.

In predriver logic circuit 68, a single-ended external clock signal labeled $K_{EXT}$ is provided to an input terminal of inverter 87 and to clock terminals labeled "K" of D type flip-flops 88 and 89. An output terminal of inverter 87 is connected to clock terminals of flip-flops 88 and 89 labeled "$\overline{K}$". Each of flips-flops 88 and 89 have an input terminal labeled "D", which is connected to an inverting output terminal of flip-flop 88 labeled "$\overline{Q}$". Inverter 91 has an input terminal coupled to an output terminal of flip-flop 88 labeled "Q", and an output terminal. NOR logic gate 92 has a first input terminal for receiving a signal labeled "$PMP_{STOP}$", a second input terminal connected to the output terminal of inverter 91, and an output terminal for providing an internal clock signal labeled "$K_{INT4}$". NOR logic gate 93 has a first input terminal for receiving signal $PMP_{STOP}$, a second input terminal connected to the output terminal of NOR logic gate 92, and an output terminal for providing an internal clock signal labeled "$K_{INT2}$". NAND logic gate 94 has a first input terminal connected to the output terminal of inverter 91, a second input terminal connected to output terminal Q of flip-flop 89, and an output terminal. Inverter 95 has an input terminal connected to the output terminal of NAND logic gate 94, and an output terminal for providing an internal clock signal labeled "$K_{INT1}$". Inverter 96 has an input terminal connected to output terminal Q of flip-flop 89, and an output terminal. NAND logic gate 97 has a first input terminal connected to the output terminal of NOR logic gate 92, a second input terminal connected to the output terminal of inverter 96, and an output terminal. Inverter 98 has an input terminal connected to the output terminal of NAND logic gate 97, and an output terminal for providing an internal clock signal labeled "$K_{INT3}$". Note that each of the logic gates represents a logic operation rather than a single logic gate.

Pump driver circuit 70 has a first input terminal for receiving internal clock signal $K_{INT1}$, a second input terminal for receiving an inhibit signal labeled "$INH_2$", a third input terminal for receiving internal clock signal $K_{INT2}$, a first output terminal for providing boosted clock signal $K_{BST1}$, and a second output terminal for providing an inhibit signal labeled "$INH_1$". Pump driver circuit 72 has a first input terminal for receiving internal clock signal $K_{INT3}$, a second input terminal for receiving inhibit signal $INH_1$, a third input terminal for receiving internal clock signal $K_{INT4}$, a first output terminal for providing boosted clock signal $K_{BST2}$, and a second output terminal for providing inhibit signal $INH_2$.

Figure 6:
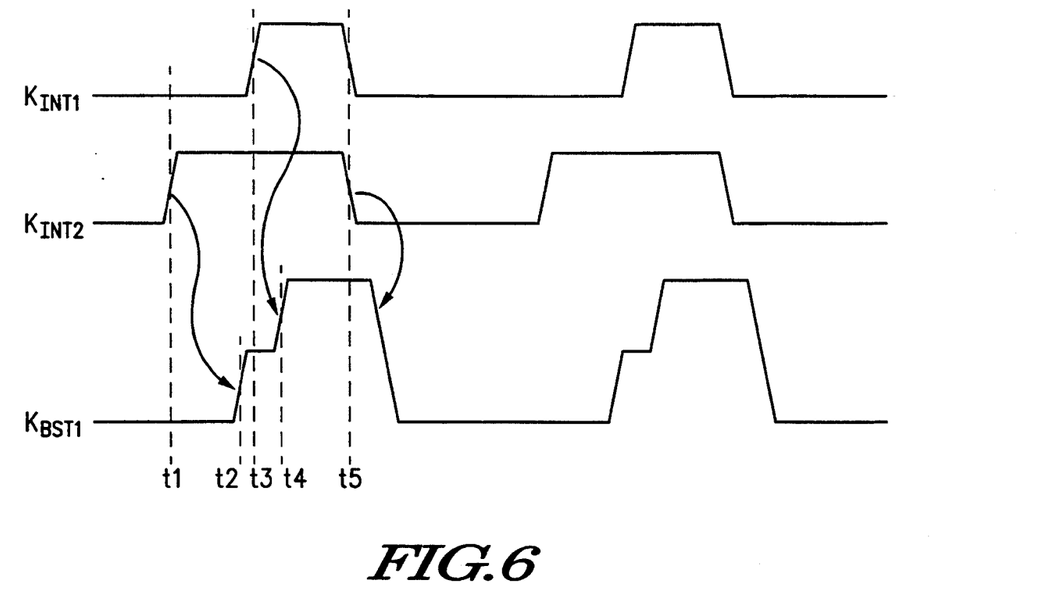
FIG. 6 shows a timing diagram of various signals of the pump driver circuit of FIG. 4.
Figure 7:
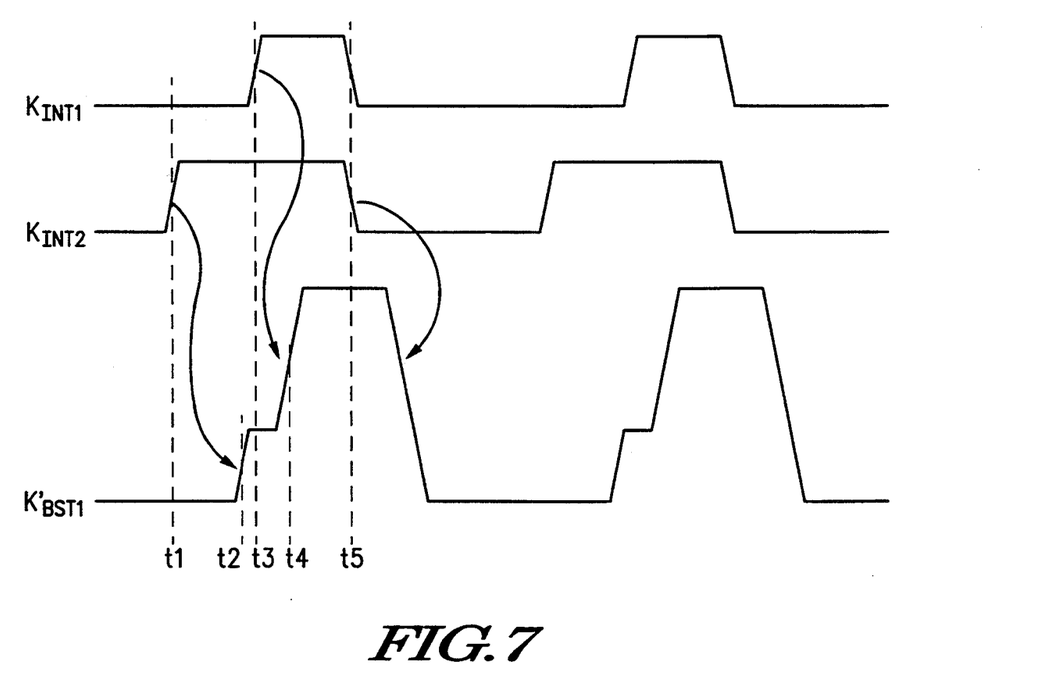
FIG. 7 shows a timing diagram of various signals of the pump driver circuit of FIG. 5.

External clock signal $K_{EXT}$ is provided to predriver logic circuit 68 at a predetermined frequency. In a preferred embodiment, external clock signal $K_{EXT}$ is the system clock. Flip-flops 88 and 89 are conventional D-type flip-flops. Flip-flop 88 functions as a frequency divider, where the output Q has a frequency that is one-half that of external clock signal $K_{EXT}$. Flip-flop 89 provides a signal at its output terminal that has a 90 degree phase shift relative to external clock signal $K_{EXT}$. The output terminals Q of flip-flops 88 and 89 are then combined by NAND logic gates 94 and 97, NOR logic gates 92 and 93, and inverters 91, 95, 96, and 98 to provide internal clock signals $K_{INT1}$, $K_{INT2}$, $K_{INT3}$, and $K_{INT4}$. The waveforms of internal clock signals $K_{INT1}$ and $K_{INT2}$ are illustrated in FIG. 6 and FIG. 7. Internal clock signal $K_{INT3}$ is the complement of internal clock signal $K_{INT1}$ and internal clock signal $K_{INT4}$ is the complement of internal clock signal $K_{INT2}$. The first input terminals of NOR logic gates 92 and 93 receive logic signal $PMP_{STOP}$. When logic signal $PMP_{STOP}$ is a logic high, charge pump 65 is disabled with each of internal clock signals $K_{INT1}$, $K_{INT2}$, $K_{INT3}$, and $K_{INT4}$ being provided as a logic low. This allows charge pump 65 to be restarted with the internal clock signals initialized in a known state.

The period or cycle of a waveform is the length of time between any two rising edges or any two falling edges of the waveform. The duty cycle of a waveform is the percentage of time that the waveform is high during the total waveform period. For example, a waveform that has a 70% duty cycle is high for 70% of the total period and low for the remaining 30% of the period. A waveform that has a 50% duty cycle is high for 50% of the total period and low for the remaining 50% of the period. And a waveform with a 20% duty cycle is high for 20% of the total period and low for the remaining 80% of the period. Internal clock signals $K_{INT1}$ and $K_{INT3}$ are two-phase nonoverlapping clock signals having a duty cycle of about 20–25%. Internal clock signals $K_{INT2}$ and $K_{INT4}$ are two-phase nonoverlapping clock signals having a duty cycle of about 50%.

Figure 4:
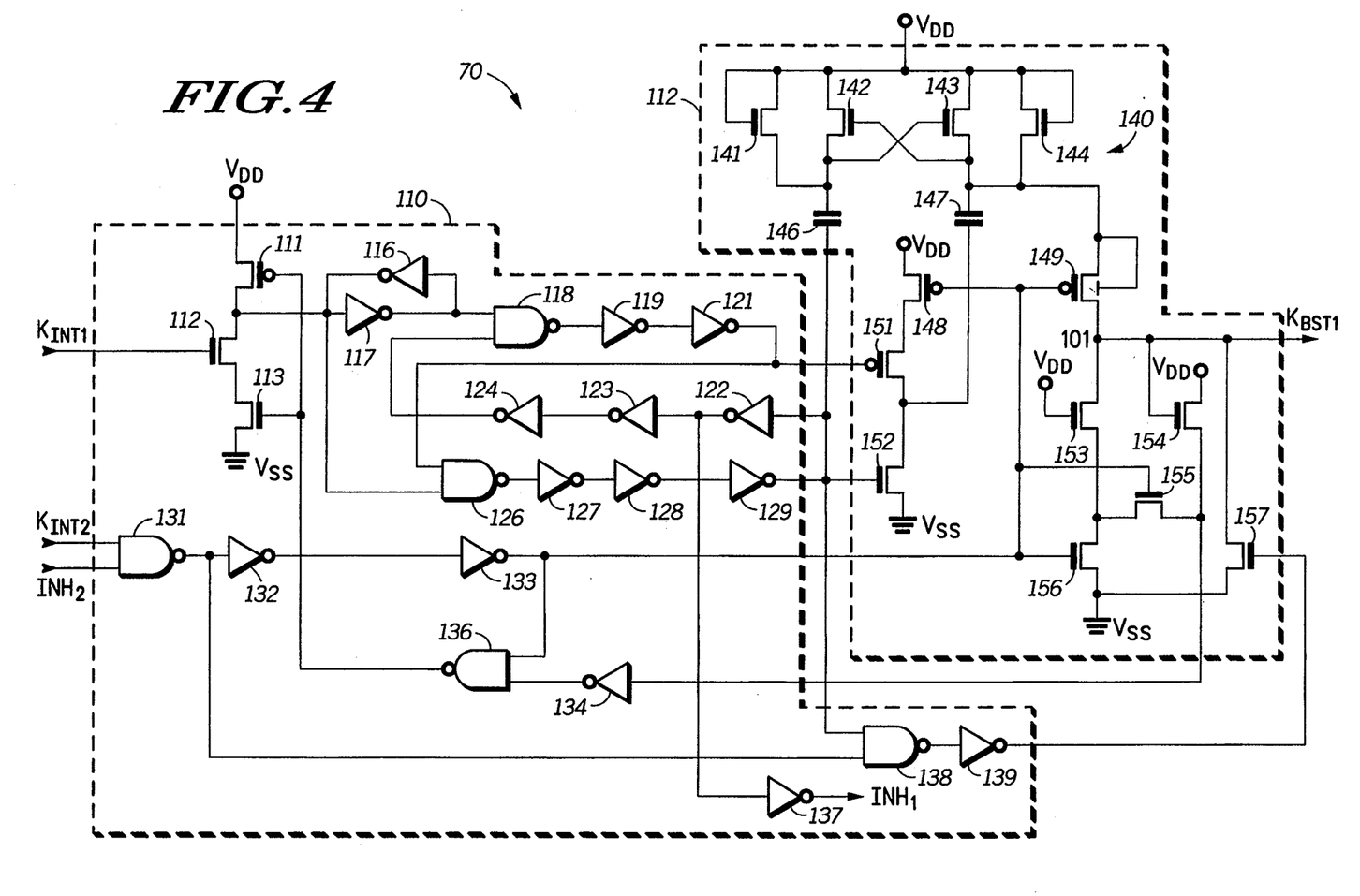
FIG. 4 illustrates in partial logic diagram form and partial schematic diagram form an embodiment of a pump driver circuit of the charge pump of FIG. 2.
Figure 5:
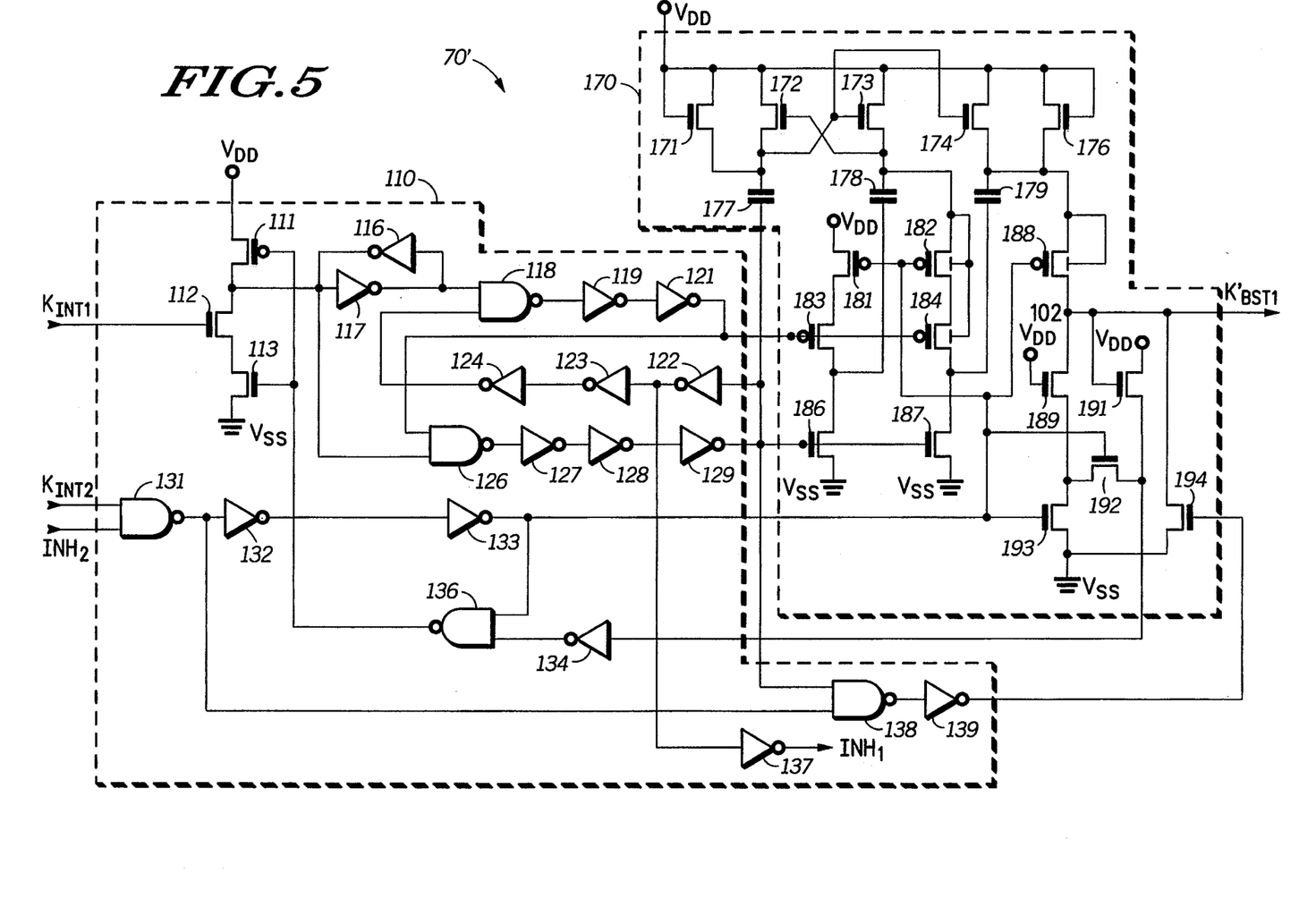
FIG. 5 illustrates in partial logic diagram form and partial schematic diagram form a pump driver circuit of the charge pump of FIG. 2 in accordance with another embodiment of the present invention.

Boosted clock signals $K_{BST1}$ and $K_{BST2}$ are provided as two-phase nonoverlapping clock signals by pump driver circuits 70 and 72, respectively. Embodiments of pump driver circuit 70 are illustrated in FIG. 4 and FIG. 5. Pump driver circuit 70 of FIG. 4 generates clock signal $K_{BST1}$ with a voltage swing that is approximately twice the magnitude of $V_{DD}$. Pump driver circuit 70' of FIG. 5 generates clock signal $K'_{BST1}$ with a voltage swing approximately equal to three times the magnitude of $V_{DD}$. Each embodiment will be discussed later in detail. Inhibit signals $INH_1$ and $INH_2$ ensure that boosted clock signals $K_{BST1}$ and $K_{BST2}$ are nonoverlapping.

Figure 3:
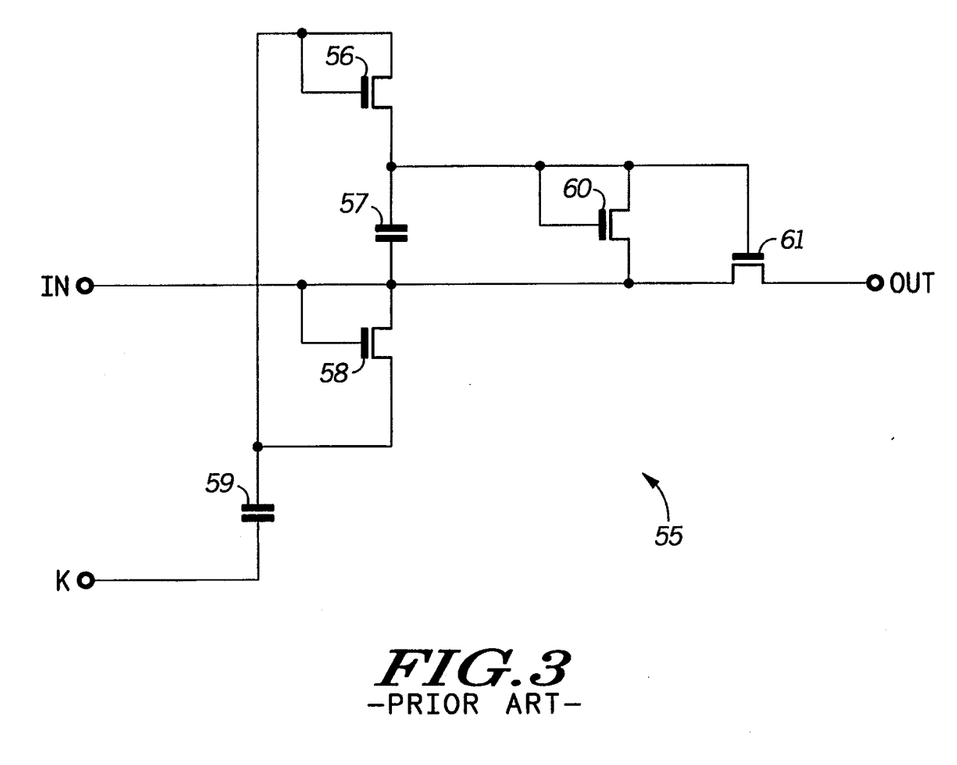
FIG. 3 illustrates in schematic diagram form a pump stage of the charge pump of FIG. 2.

FIG. 3 illustrates in schematic diagram form prior art pump stage 55. Pump stage 55 represents the circuitry of each of pump stages 75–80. Pump stage 55 includes N-channel transistors 56, 58, 60, and 61, and capacitors 57 and 59. Diode-connected N-channel transistor 56 has a gate and a drain connected together, and a source. Capacitor 57 has a first terminal connected to the source of N-channel transistor 56, and a second terminal connected to an input terminal labeled "IN". N-channel transistor 58 has a gate and a drain connected to the second terminal of capacitor 57, and a source connected to the gate and drain of N-channel transistor 56. Capacitor 59 has a first terminal connected to the source of N-channel transistor 58, and a second terminal connected to a clock terminal labeled "K". Diode connected N-channel transistor 60 has a gate and a drain connected to the source of N-channel transistor 56, and a source connected to the second terminal of capacitor 57. N-channel pass transistor 61 has a first drain/source terminal connected to input terminal IN, a second drain/source terminal connected to an output terminal labeled "OUT", and a gate connected to the source of N-channel transistor 56.

In operation, N-channel transistors 73 and 74 (see FIG. 2) function as a first pump stage for series connected pump stages 66, and provide input voltage $V_I$ to input terminal IN of pump stage 75. N-channel transistor 73 is diode-connected and precharges capacitor 81 to a voltage equal to $V_{DD}$ minus a threshold voltage drop ($V_T$). When boosted clock signal $K_{BST1}$ is a logic high and boosted clock signal $K_{BST2}$ is a logic low, N-channel transistor 74 is conductive, input voltage $V_I$ is substantially equal to $V_{DD}$, and the potential at the second terminal of capacitor 81 is at zero volts (or ground potential). Boosted clock signal $K_{BST1}$ becomes a logic low, causing N-channel transistor 74 to be substantially non-conductive and boosted clock signal $K_{BST2}$ becomes a logic high (after a delay to provide nonoverlap), boosting input voltage $V_I$ to a voltage equal to about $V_{DD}$ above the voltage swing of boosted clock signal $K_{BST2}$. Input voltage $V_I$ is provided to input terminal IN of pump stage 75.

When a logic high boosted clock signal $K_{BST1}$ is provided to clock terminal K of pump stages 75, 77, and 79, a bias voltage of equal to one $V_T$ is established across diode-connected N-channel transistor 60 (FIG. 3). On the previous cycle, that is, when boosted clock signal $K_{BST2}$ is a logic high, diode-connected N-channel transistor 60 of pump stages 76, 78, and 80 had a one $V_T$ bias voltage established across them. Having established the bias conditions, when boosted clock signal $K_{BST2}$ becomes a logic high, input voltage $V_I$ is boosted by a voltage equal to the voltage swing of boosted clock signal $K_{BST1}$, and is passed through N-channel pass transistor 61 (FIG. 3) to output terminal OUT. Each successive pump stage boosts the voltage received at its input terminal by a voltage substantially equal to the voltage swing of boosted clock signals $K_{BST1}$ and $K_{BST2}$, until the output terminal of pump stage 80 provides a boosted output voltage $V_{PP}$ equal to approximately 18 to 21 volts.

By providing clock signals to series connected pump stages 66 that have a voltage swing greater than $V_{DD}$, bias voltages in pump stages 75–80 are maintained even when $V_{DD}$ is low and/or when $V_T$ in the latter pump stages is relatively large, and charge transfer efficiency is improved. In the preferred embodiment, capacitors 81–86 are high voltage planar capacitors. However, in other embodiments different types of capacitors may be used, such as MOS transistor capacitors, or polysilicon capacitors.

The gate-to-source voltage ($V_{GS}$) of N-channel pass transistor 61 must be above its threshold voltage ($V_T$) in order for pass transistor 61 to become conductive. A bootstrap circuit comprising N-channel transistors 56, 58, and 60, and capacitors 57 and 59 ensures that the $V_{GS}$ of N-channel pass transistor 61 in each of pump stages 75–80 is above $V_T$, by bootstrapping, or boosting the gate voltage of pass transistor 61. This increases the efficiency of charge pump 10 by allowing more charge to pass through each pump stage.

FIG. 4 illustrates in partial logic diagram form and partial schematic diagram form pump driver circuit 70. Pump driver circuit 70 includes control logic circuit 110 and voltage boosting circuit 112. Control logic circuit 110 includes P-channel transistor 111, N-channel transistors 112 and 113, inverters 116, 117, 119, 121, 122, 123, 124, 127, 128, 129, 132, 133, 134, 137, and 139, and NAND logic gates 118, 126, 131, 136, and 138. Voltage boosting circuit 112 includes N-channel transistors 141, 142, 143, 144, 152, 153, 154, 155, 156, and 157, P-channel transistors 148, 149, and 151, and capacitors 146 and 147.

P-channel transistor 111 of control logic circuit 110 has a source connected to power supply voltage terminal $V_{DD}$, a gate, and a drain. N-channel transistor 112 has a drain connected to the drain of P-channel transistor 111, a gate for receiving internal clock signal $K_{INT1}$, and a source. N-channel transistor 113 has a drain connected to the source of N-channel transistor 112, a gate connected to the gate of P-channel transistor 111, and a source connected to a power supply voltage terminal labeled "$V_{SS}$". Inverter 116 has an output terminal connected to the drain of P-channel transistor 111, and an input terminal. Inverter 117 has an input terminal connected to the output terminal of inverter 116, and an output terminal connected to the input terminal of inverter 116. NAND logic gate 118 has a first input terminal connected to the output terminal of inverter 117, a second input terminal, and an output terminal. Inverter 119 has an input terminal connected to the output terminal of NAND logic gate 118, and an output terminal. Inverter 121 has an input terminal connected to the output terminal of inverter 119, and an output terminal. Inverter 122 has an input terminal connected to the output terminal of inverter 129, and an output terminal. Inverter 123 has an input terminal connected to the output terminal of inverter 122, and an output terminal. Inverter 124 has in input terminal connected to the output terminal of inverter 123, and an output terminal connected to the second input terminal of NAND logic gate 118. NAND logic gate 126 has a first input terminal connected to the output terminal of inverter 121, and second input terminal connected to the drain of P-channel transistor 111, and an output terminal. Inverter 127 has an input terminal connected to the output terminal of NAND logic gate 126, and an output terminal. Inverter 128 has an input terminal connected to the output terminal of inverter 127, and an output terminal. Inverter 129 has an input terminal connected to the output terminal of inverter 128, and an output terminal connected to the input terminal of inverter 122. NAND logic gate 131 has a first input terminal for receiving internal clock signal $K_{INT2}$, a second input terminal for receiving inhibit signal $INH_2$, and an output terminal. Inverter 132 has an input terminal connected to the output terminal of NAND logic gate 131, and an output terminal. Inverter 133 has an input terminal connected to the output terminal of inverter 132, and an output terminal. NAND logic gate 136 has a first input terminal connected to the output terminal of inverter 133, a second input terminal, and an output terminal connected to the gates of P-channel transistor 111 and N-channel transistor 113. Inverter 134 has an output terminal connected to the second input terminal of NAND logic gate 136, and an input terminal. Inverter 137 has an input terminal connected to the output terminal of inverter 122, and an output terminal for providing inhibit signal $INH_1$. NAND logic gate 138 has a first input terminal connected to the output terminal of inverter 129, a second input terminal connected to the output terminal of NAND logic gate 131, and an output terminal. Inverter 139 has an input terminal connected to the output terminal of NAND logic gate 138, and an output terminal.

N-channel transistor 141 of voltage boosting circuit 112 has a drain connected to $V_{DD}$, a gate connected to $V_{DD}$, and a source. N-channel transistor 142 has a drain connected to $V_{DD}$, a gate, and a source connected to the source of N-channel transistor 141. N-channel transistor 143 has a drain connected to $V_{DD}$, a gate connected to the source of N-channel transistor 142, and a source connected to the gate of N-channel transistor 142. N-channel transistor 144 has a drain connected to $V_{DD}$, a gate connected to $V_{DD}$, and a source connected to the source of N-channel transistor 143. Bootstrap capacitor 146 has a first terminal connected to the sources of N-channel transistors 141 and 142, and a second terminal connected to the output terminal of inverter 129. Boosting capacitor 147 has a first terminal connected to the sources of N-channel transistors 143 and 144, and a second terminal. P-channel transistor 148 has a source connected to $V_{DD}$, a gate connected to the output terminal of inverter 133, and a drain. P-channel transistor 149 has a source connected to the source of N-channel transistor 143, a gate connected to the gate of P-channel transistor 148, and a drain connected to output node 101 for providing boosted clock signal $K_{BST1}$. P-channel transistor 149 is located in an N-well region of the semiconductor substrate and has an N-well terminal connected to its source terminal. P-channel transistor 151 has a source connected to the drain of P-channel transistor 148, a gate connected to the output terminal of inverter 121, and a drain connected to the second terminal of capacitor 147. N-channel transistor 152 has a drain connected to the drain of P-channel transistor 151, a gate connected to the output terminal of inverter 129, and a source connected to $V_{SS}$. N-channel transistor 153 has a drain connected to the drain of P-channel transistor 149 at output node 101, a gate connected to $V_{DD}$, and a source. N-channel transistor 154 has a drain connected to $V_{DD}$, a gate connected to the drain of P-channel transistor 149 at output node 101, and a source connected to the input terminal of inverter 134. N-channel transistor 155 has a first drain/source terminal connected to the source of N-channel transistor 153, a second drain/source terminal connected to the source of N-channel transistor 154, and a gate connected to the output terminal of inverter 133. N-channel transistor 156 has a drain connected to the source of N-channel transistor 153, a gate connected to the output terminal of inverter 133, and a source connected to $V_{SS}$. N-channel transistor 157 has a drain connected to the drain of P-channel transistor 149 at output node 101, a gate connected to the output terminal of inverter 139, and a source connected to $V_{SS}$. The circuitry of pump driver circuit 72 (FIG. 3) is identical to, and operates in a manner similar to pump driver circuit 70, and is therefore not shown.

Control logic circuit 110 receives internal clock signals $K_{INT1}$ and $K_{INT2}$, and provides sequencing and control logic to voltage boosting circuit 112. Voltage boosting circuit 112 then provides boosted clock signal $K_{BST1}$ having a voltage swing with a magnitude a predetermined voltage level greater than a magnitude of $V_{DD}$. As illustrated in FIG. 6, boosted clock signals $K_{BST1}$ and $K_{BST2}$ are provided in two periods, a precharge period and a boost period. In the precharge period, output node 101 is precharged to $V_{DD}$ and capacitor 147 is charged to $V_{DD}$. During the boost period, boosted clock signal $K_{BST1}$ is provided at output node 101 at a voltage equal to approximately $V_{DD}$, plus the charge accumulated in capacitor 147 minus any parasitic diode losses. Therefore, in a preferred embodiment, boosted clock signal $K_{BST1}$ is provided at about 1.7 $V_{DD}$. The voltage swing of boosted clock signal $K_{BST2}$ has a magnitude equal to the magnitude of $K_{BST1}$.

Referring now to FIG. 6, prior to time t1, both of internal clock signals $K_{INT1}$ and $K_{INT2}$ start a logic cycle as logic low voltages. N-channel transistor 112 is substantially non-conductive, and a logic high is provided at the output terminal of NAND logic gate 131. This causes both of N-channel transistors 156 and 157 to be conductive, and output node 101 is reduced to a logic low voltage. N-channel transistor 154 is substantially non-conductive, causing a logic low voltage to be provided at its source. A logic low voltage is provided to the input terminal of inverter 134, which provides a logic high to the second input terminal of NAND logic gate 136. Both input terminals of NAND logic gate 136 are at logic high voltages, causing a logic low to be provided to the gates of P-channel transistor 111 and N-channel transistor 112. P-channel transistor 111 is therefore conductive and both of N-channel transistors 112 and 113 are substantially non-conductive, resulting in a logic high being provided to the input terminal of inverter 117. A logic high voltage is provided to the gate of P-channel transistor 151 through inverters 119 and 121, causing P-channel transistor 151 to be substantially non-conductive. A logic high voltage is provided to the first and second input terminals of NAND logic gate 126, resulting in NAND logic gate 126 providing a logic low at its output terminal. A logic high is then provided to the gate of N-channel transistor 152 through inverters 127, 128, and 129, causing N-channel transistor 152 to be conductive. This causes the second terminal of boosting capacitor 147 to be pulled to the potential of $V_{SS}$. The logic high at the output terminal of inverter 129 pulls the second terminal of bootstrap capacitor 146 to a voltage equal to about $V_{DD}$, causing the voltage at the gate of N-channel transistor 143 to be boosted above $V_{DD}$. N-channel transistor 143 is conductive and precharges capacitor 147 to substantially $V_{DD}$. By boosting the gate of N-channel transistor 143 above $V_{DD}$, a threshold voltage drop across N-channel transistor 143 is avoided, allowing boosting capacitor 147 to be charged to about $V_{DD}$.

The precharge period starts at time t1 (FIG. 6). At time $t_1$, internal clock signal $K_{INT2}$, from predriver circuit 68 (FIG. 3) is a logic high and internal clock signal $K_{INT1}$ is a logic low. Logic low internal clock signal $K_{INT1}$ is provided to the gate of N-channel transistor 112, causing N-channel transistor 112 to be substantially non-conductive. Logic high internal clock signal $K_{INT2}$ is provided to the first input terminal of NAND logic gate 131 and inhibit signal $INH_2$ is provided to the second input terminal of NAND logic gate 131. Inhibit signals $INH_1$ and $INH_2$ ensure that boosted clock signals $K_{BST1}$ and $K_{BST2}$ are nonoverlapping clock signals. When both internal clock signal $K_{INT2}$ and inhibit signal $INH_2$ are logic highs, output node 101 is precharged to about $V_{DD}$. NAND logic gate 131 provides a logic low signal at its output terminal, resulting in N-channel transistors 156 and 157 being substantially non-conductive, and in P-channel transistors 148 and 149 being conductive. Output node 101 is precharged to about $V_{DD}$ through N-channel transistor 143, which is conductive due to the boosted voltage level at its gate. Note that diode-connected N-channel transistor 144 ensures that capacitor 147 is precharged to $V_{DD}-V_T$ during initial start-up. N-channel transistor 154 is conductive when output node 101 is a logic high, thus providing a logic high to the input terminal of inverter 134. A logic low is then provided to the second input terminal of NAND logic gate 136, causing NAND logic gate 136 to provide a logic high to the gates of P-channel transistor 111 and N-channel transistor 113. P-channel transistor 111 is non-conductive and N-channel transistor 113 is conductive. However, the output terminal of inverter 117 remains "latched" at a logic low by inverter 116 until internal clock signal $K_{INT1}$ becomes a logic high at time t3.

At time t3, internal clock signal $K_{INT1}$ becomes a logic high causing N-channel transistor 112 to be conductive. P-channel transistor 111 is non-conductive and N-channel transistor 113 is conductive, causing the input terminal of inverter 117 to be at a logic low. The output terminal of NAND logic gate 118 remains temporarily unchanged at a logic high. The output terminal of NAND logic gate 126 transitions from a logic low to a logic high, causing N-channel transistor 152 to become substantially non-conductive. The second input terminal of NAND logic gate 118 then transitions to a logic high through inverters 122, 123, and 124, causing the output terminal of NAND logic gate 118 to be a logic low. The gate of P-channel transistor 151 is a logic low, causing P-channel transistor 151 to become conductive. Both of P-channel transistors 148 and 151 are now conductive, and N-channel transistor 152 is substantially non-conductive, boosting the second terminal of capacitor 147 to a voltage equal to approximately $V_{DD}$. The charge stored in capacitor 147 is provided through P-channel transistor 149 to output node 101, causing output node 101 to be boosted above its precharge voltage by a voltage equal to approximately $V_{DD}$. Therefore, boosted clock signal $K_{BST1}$ is provided at about 2 $V_{DD}$ minus any parasitic diode losses through P-channel transistor 149.

The boost period occurs between time t3 and time t5, when internal clock signal $K_{INT1}$ is a logic high. During the boost period, inhibit signal $INH_1$ is provided to pump driver circuit 72 as a logic low to prevent boosted clock signal $K_{BST2}$ from becoming a logic high until $K_{BST1}$ is a logic low. The boosted voltage from capacitor 147 also serves to bootstrap the gate of N-channel transistor 142, causing capacitor 146 to be charged to about $V_{DD}$ during the boost period of pump driver circuit 70.

At time t5, internal clock signal $K_{INT2}$ returns to a logic low, resulting in N-channel transistors 156 and 157 becoming conductive and P-channel transistors 148 and 149 becoming substantially non-conductive. The voltage at output node 101 is reduced to a logic low, as illustrated in FIG. 6 after time t5. Internal clock signal $K_{INT1}$ returns to a logic low, causing N-channel transistor 152 to be conductive, and P-channel transistor 151 to be substantially non-conductive. This reduces the voltage at the second terminal of capacitor 147 to about the potential of $V_{SS}$, and starts another precharge period.

The N-well terminal of P-channel transistor 149 is connected to a high potential (the first terminal of boosting capacitor 147) to prevent forward biasing of the parasitic diodes in P-channel transistor 149. N-channel transistor 153 is provided to protect N-channel transistor 156 from field-aided breakdown. N-channel transistors 154 and 155 sense the voltage level of node 101 and provide a feedback signal to the input terminal of inverter 134. N-channel transistor 155 is relatively weak and N-channel transistor 154 is relatively strong. Boosting capacitor 147 is a planar capacitor and is relatively large in order to provide a high drive capability for series connected pump stages 66 (FIG. 3).

FIG. 5 illustrates in partial logic diagram form and partial schematic diagram form pump driver circuit 70' in accordance with another embodiment of the present invention. Pump driver circuit 70' may be substituted for pump driver circuit 70 of FIG. 4. Pump driver circuit 70' provides a boosted clock signal to series connected pump stages 66 (FIG. 3) that is equal to approximately 3 $V_{DD}$. This allows charge pump 65 to operate at very low power supply voltages. Pump driver circuit 70' includes control logic circuit 110 and voltage boosting circuit 170. Control logic circuit 110 of FIG. 5 has the same structure and the same function as control logic circuit 110 of FIG. 4, and therefore has the same reference numbers. Voltage boosting circuit 170 includes N-channel transistors 171, 172, 173, 174, 176, 186, 187, 189, 191, 192, 193, and 194, capacitors 177, 178, and 179, and P-channel transistors 181, 182, 183, 184, and 188.

N-channel transistor 171 is diode-connected and has a drain and a gate connected to $V_{DD}$, and a source. N-channel transistor 172 has a drain connected to $V_{DD}$, a gate and a source connected to the source of N-channel transistor 171. N-channel transistor 173 has a drain connected to $V_{DD}$, a gate connected to the source of N-channel transistor 172, and a source connected to the gate of N-channel transistor 172. N-channel transistor 174 has a drain connected to $V_{DD}$, a gate connected to the gate of N-channel transistor 173, and a source. N-channel transistor 176 is diode-connected and has a drain and a gate connected to $V_{DD}$, and a source connected to the source of N-channel transistor 174. Capacitor 177 has a first terminal connected to the sources of N-channel transistors 171 and 172, and a second terminal connected to the input terminal of inverter 122. Capacitor 178 has a first terminal connected to the source of N-channel transistor 173, and a second terminal. Capacitor 179 has a first terminal connected to the sources of N-channel transistors 174 and 176, and a second terminal. P-channel transistor 181 has a source connected to $V_{DD}$, a gate connected to the output terminal of inverter 133, and a drain. P-channel transistor 183 has a source connected to the drain of P-channel transistor 181, a gate connected to the output terminal of inverter 121, and a drain connected to the second terminal of capacitor 178. P-channel transistor 182 has a source and a substrate terminal connected to the first terminal of capacitor 178, a gate connected to the gate of P-channel transistor 181, and a drain. P-channel transistor 184 has a source connected to the drain of P-channel transistor 182, a substrate terminal connected to the source of P-channel transistor 182, a gate connected to the gate of P-channel transistor 183, and a drain connected to the second terminal of capacitor 179. N-channel transistor 186 has a drain connected to the drain of P-channel transistor 183, a gate connected to the input terminal of inverter 129, and a source connected to $V_{SS}$. N-channel transistor 187 has a source connected to the drain of P-channel transistor 184, a gate connected to the gate of N-channel transistor 186, and a source connected to $V_{SS}$. P-channel transistor 188 has a source and a substrate terminal connected to the sources of N-channel transistors 174 and 176, a gate connected to the output terminal of inverter 133, and a drain connected to output node 102 for providing a boosted clock signal labeled "$K'_{BST1}$". P-channel transistors 182, 184, and 188 are located in an N-well region of the semiconductor substrate. P-channel transistors 182 and 188 have their N-well terminals connected to their source terminals. P-channel transistor 184 has an N-well terminal connected to the source of P-channel transistor 182. N-channel transistor 189 has a drain connected to the drain of P-channel transistor 188 at output node 102, a gate connected to $V_{DD}$, and a source. N-channel transistor 191 has a drain connected to $V_{DD}$, a gate connected to the drain of P-channel transistor 188 at output node 102, and a source connected to the input terminal of inverter 134. N-channel transistor 192 has a first drain/source terminal connected to the source of N-channel transistor 189, a gate connected to the output terminal of inverter 133, and a second drain/source terminal connected to the source of N-channel transistor 191. N-channel transistor 193 has a drain connected to the source of N-channel transistor 189, a gate connected to the output terminal of inverter 133, and a source connected to $V_{SS}$. N-channel transistor 194 has a drain connected to the drain of P-channel transistor 188 at output node 102, a gate connected to the output terminal of inverter 139, and a source connected to $V_{SS}$.

In operation, pump driver circuit 70' provides a boosted clock signal $K'_{BST1}$ to series connected pump stages 66 of charge pump 65 of FIG. 3. A second pump driver circuit (not shown), identical to 70' would be used to provide a boosted clock signal $K'_{BST2}$ corresponding to $K_{BST2}$. Pump driver circuit 70' operates in a manner similar to pump driver circuit 70 of FIG. 4. However, pump driver circuit 70' provides boosted clock signal $K'_{BST1}$ at approximately 3 $V_{DD}$ during the boost period. This allows for operation at very low power supply voltages, such as 3.3 volts or below.

Referring now to FIG. 7, prior to time t1, both of internal clock signals $K_{INT1}$ and $K_{INT2}$ are at logic low voltages. N-channel transistor 112 is substantially non-conductive, and a logic high is provided at the output terminal of NAND logic gate 131. This causes both of N-channel transistors 193 and 194 to be conductive, and output node 102 is reduced to a logic low voltage. N-channel transistor 191 is substantially non-conductive, causing a logic low voltage to be provided at its source terminal. A logic low voltage is provided to the input terminal of inverter 134 which provides a logic high to the second input terminal of NAND logic gate 136. Both input terminals of NAND logic gate 136 are at logic high voltages, causing a logic low to be provided to the gates of P-channel transistor 111 and N-channel transistor 112. P-channel transistor 111 is therefore conductive and both of N-channel transistors 112 and 113 are substantially non-conductive, resulting in a logic high being provided to the input terminal of inverter 117. A logic high voltage is provided to the gates of P-channel transistors 183 and 184, causing P-channel transistors 183 and 184 to be substantially non-conductive. A logic high voltage is provided to the first and second input terminals of NAND logic gate 126, resulting in NAND logic gate 126 providing a logic low at its output terminal. A logic high is then provided to the gates of N-channel transistors 186 and 187 through inverters 127, 128, and 129, causing N-channel transistor 186 and 187 to be conductive. This causes the second terminals of boosting capacitors 178 and 179 to be pulled to the potential of $V_{SS}$. The logic high at the output terminal of inverter 129 pulls the second terminal of bootstrap capacitor 177 to a voltage equal to about $V_{DD}$, causing the voltage at the gates of N-channel transistors 173 and 174 to be boosted above $V_{DD}$. N-channel transistors 173 and 174 are conductive, and precharge boosting capacitors 178 and 179 to substantially $V_{DD}$. By boosting the gates of N-channel transistors 173 and 174 above $V_{DD}$, a threshold voltage drop across N-channel transistors 173 and 174 is avoided, allowing boosting capacitors 178 and 179 to be charged to $V_{DD}$.

The precharge period starts at time t1, as illustrated in FIG. 7. At time $t_1$ internal clock signal $K_{INT2}$, from predriver circuit 68 (FIG. 3), is a logic high and internal clock signal $K_{INT1}$ is a logic low. Logic low internal clock signal $K_{INT1}$ is provided to the gate of N-channel transistor 112, causing N-channel transistor 112 to be substantially non-conductive. Logic high internal clock signal $K_{INT2}$ is provided to the first input terminal of NAND logic gate 131 and inhibit signal $INH_2$ is provided to the second input terminal of NAND logic gate 131. Inhibit signals $INH_1$ and $INH_2$ ensure that boosted clock signals $K_{BST1}$ and $K_{BST2}$ are nonoverlapping clock signals. When both internal clock signal $K_{INT2}$ and inhibit signal $INH_2$ are logic highs, output node 102 is precharged to about $V_{DD}$. NAND logic gate 131 provides a logic low signal at its output terminal, resulting in N-channel transistors 193 and 194 being substantially non-conductive, and in P-channel transistors 181,182, and 188 being conductive. Output node 102 is precharged to about $V_{DD}$ through diode-connected N-channel transistor 176 and P-channel transistor 188, as illustrated at time t2 in FIG. 7. N-channel transistor 191 is conductive when output node 102 is a logic high, thus providing a logic high to the input terminal of inverter 134. A logic low is then provided to the second input terminal of NAND logic gate 136, causing NAND logic gate 136 to provide a logic high to the gates of P-channel transistor 111 and N-channel transistor 113. P-channel transistor 111 is non-conductive and N-channel transistor 113 is conductive. However, the output terminal of inverter 117 remains "latched" at a logic low by inverter 116 until internal clock signal $K_{INT1}$ becomes a logic high at time t3.

At time t3, internal clock signal $K_{INT1}$ becomes a logic high causing N-channel transistor 112 to be conductive. P-channel transistor 111 is non-conductive and N-channel transistor 113 is conductive, causing the input terminal of inverter 117 to be at a logic low. The output terminal of NAND logic gate 118 remains temporarily unchanged at a logic high. The output terminal of NAND logic gate 126 transitions from a logic low to a logic high, causing N-channel transistor 186 and 187 to become substantially non-conductive. The second input terminal of NAND logic gate 118 then transitions to a logic high through inverters 122, 123, and 124, causing the output terminal of NAND logic gate 118 to be a logic low. The gates of P-channel transistors 183 and 184 is a logic low, causing P-channel transistors 183 and 184 to become conductive. P-channel transistors 181, 183, 182, and 184 are now conductive, and N-channel transistors 186 and 187 is substantially non-conductive, boosting the second terminals of boosting capacitors 178 and 179 to approximately $V_{DD}$. The charge stored in boosting capacitor 178 is provided to the second terminal of capacitor boosting 179 through P-channel transistor 182 and 184, so that the second terminal of capacitor boosting 179 is at a voltage equal to approximately 2 $V_{DD}$, boosting the voltage at output node 102 to approximately 3 $V_{DD}$ through P-channel transistor 188. Therefore, boosted clock signal $K_{BST1}$ is provided at about 3 $V_{DD}$ minus any parasitic diode losses through P-channel transistors 182, 184, and 188.

During the boost period, that is, when internal clock signal $K_{INT1}$ is a logic high, inhibit signal $INH_1$ is provided to pump driver circuit 72 to ensure the boosted clock signals do not overlap. The boosted voltage from boosting capacitors 178 and 179 also serves to bootstrap N-channel transistors 172 and 174, causing boosting capacitor 177 to be precharged to $V_{DD}$ during the boost period.

At time t5, internal clock signal $K_{INT2}$ returns to a logic low, resulting in N-channel transistors 193 and 194 becoming conductive and P-channel transistors 181, 182, and 188 becoming substantially non-conductive. The voltage at output node 102 is reduced to a logic low, as illustrated in FIG. 7 after time t5. Internal clock signal $K_{INT1}$ returns to a logic low, causing N-channel transistors 186 and 187 to be conductive, and causing P-channel transistors 183 and 184 to be substantially non-conductive. This reduces the voltage at the second terminal of capacitors 178 and 179 to about the potential of $V_{SS}$, and starts another precharge period.

The N-well terminal of P-channel transistors 182, 184, and 188 are connected to a high potential to prevent forward biasing of the parasitic diodes in P-channel transistors 182, 184, and 188. N-channel transistor 189 is provided to protect N-channel transistor 193 from field-aided breakdown. N-channel transistors 191 and 192 sense the voltage level of node 102 and provide a feedback signal to the input terminal of inverter 134. N-channel transistor 192 is relatively weak and N-channel transistor 191 is relatively strong. Boosting capacitors 178 and 179 are planar capacitors and are sized to provide approximately the same combined charge as boosting capacitor 147 of FIG. 4. It is preferable for capacitors 147 (FIG. 4) and capacitors 178 and 179 to be as large as possible, taking into account layout constraints such as available surface area.

Charge pump 65 provides the advantage of extending the power supply voltage range over which series-connected pump stages 66 is able to satisfactorily transfer charge, thus allowing for low voltage and thus, battery powered applications. Also, providing a boosted clock signal to series connected pump stages 66 reduces the number of pump stages required to achieve a desired output voltage $V_{PP}$. The effect of this reduction in pump stages is an increase in charge output each clock cycle. In addition, relative to prior art charge pump 10, current drive capability is increased because there are fewer pump stages. Furthermore, there is a substantial improvement in the charge output per unit of layout area.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. A charge pump with controlled ramp rate, comprising:
    a charge pump for receiving a clock signal, and in response, providing an output voltage having a magnitude greater than a magnitude of said clock signal;
    an RC differentiator circuit, coupled to said charge pump, for receiving said output voltage, and providing a control voltage at an output terminal, said control voltage proportional to a ramp-up rate of said output voltage;
    a load element having a first terminal coupled to a first power supply voltage terminal, and a second terminal;
    a transistor having a first current electrode coupled to said second terminal of said load element, a second current electrode coupled to a second power supply voltage terminal, and a control electrode coupled to said output terminal of said RC differentiator circuit; and
    an inverter/buffer circuit having an input terminal coupled to said first current electrode of said transistor, and an output terminal for providing a control signal of a first logic state for disabling said charge pump in response to said control voltage increasing above a predetermined switching point, said inverter/buffer circuit providing said control signal at a second logic state for enabling said charge pump in response to said control voltage decreasing below said predetermined switching point.

2. The charge pump of claim 1, wherein said RC differentiator circuit comprises:
    a capacitor having a first terminal for receiving said output voltage, and a second terminal coupled to said control electrode of said transistor for providing said control voltage; and
    resistance means for resistively coupling said second terminal of said capacitor to said second power supply voltage terminal.

3. The charge pump of claim 2, wherein said resistance means comprises a switched capacitor circuit.

4. The charge pump of claim 3, wherein said switched capacitor circuit comprises:
    clock means for providing first and second nonoverlapping clock signals;
    a second transistor having a first current electrode coupled to said second terminal of said capacitor, a control electrode for receiving said first nonoverlapping clock signal, and a second current electrode;
    a second capacitor having a first terminal coupled to said second current electrode of said second transistor, and a second terminal coupled to said power supply voltage terminal; and
    a third transistor having a first current electrode coupled to said first terminal of said second capacitor, a second current electrode coupled to said second power supply voltage terminal, and a control electrode for receiving said second nonoverlapping clock signal.

5. The charge pump of claim 4, wherein said clock means comprises:
  a frequency divider circuit for receiving said clock signal, and in response, providing a second clock signal having a frequency that is less than a frequency of said clock signal; and
  a clock control logic circuit, coupled to said frequency divider circuit, for receiving said second clock signal, and providing said first and second nonoverlapping clock signals.

6. The charge pump of claim 5, wherein said frequency divider circuit comprises a plurality of D-type flip-flops.

7. A charge pump with controlled ramp rate, comprising:
  a charge pump having a plurality of series-connected pump stages for receiving a clock signal, and in response, providing an output voltage having a magnitude greater than a magnitude of said clock signal;
  an RC differentiator circuit, comprising:
    a capacitor having a first terminal coupled to said charge pump, for receiving said output voltage, and having a second terminal for providing a control voltage proportional to a ramp-up rate of said output voltage; and
    a switched capacitor circuit having a first terminal coupled to said second terminal of said capacitor, and a second terminal coupled to a negative power supply voltage terminal, said switched capacitor circuit receiving first and second nonoverlapping clock signals, and resistively coupling said second terminal of said capacitor to said negative power supply voltage terminal; and
  a trigger circuit, coupled to said RC differentiator circuit, for receiving said control voltage, and in response to said control voltage increasing above a predetermined switching point, providing a first control signal to disable said charge pump, and in response to said control voltage decreasing below said predetermined switching point, providing a second control signal to enable said charge pump.

8. The charge pump of claim 7, wherein said switched capacitor circuit comprising:
  clock means for providing first and second nonoverlapping clock signals;
  a first transistor having a first current electrode coupled to said second terminal of said capacitor, a control electrode for receiving said first nonoverlapping clock signal, and a second current electrode;
  a second capacitor having a first terminal coupled to said second current electrode of said first transistor, and a second terminal coupled to said negative power supply voltage terminal; and
  a second transistor having a first current electrode coupled to said first terminal of said second capacitor, a second current electrode coupled to said negative power supply voltage terminal, and a control electrode for receiving said second nonoverlapping clock signal.

9. The charge pump of claim 8, wherein said clock means comprises:
  a frequency divider circuit for receiving said clock signal, and in response, providing a second clock signal having a frequency that is less than a frequency of said clock signal; and
  a clock control logic circuit, coupled to said frequency divider circuit, for receiving said second clock signal, and providing said first and second nonoverlapping clock signals.

10. The charge pump of claim 9, wherein said frequency divider circuit comprises a plurality of D-type flip-flops.

11. The charge pump of claim 7, wherein said trigger circuit comprises:
  a first P-channel transistor having a source coupled to a positive power supply voltage terminal, a gate coupled to a negative power supply voltage terminal, and a drain;
  a second P-channel transistor having a source coupled to said positive power supply voltage terminal, a gate, and a drain coupled to said drain of said first P-channel transistor;
  a third P-channel transistor having a source coupled to said drains of said first and second P-channel transistors, a gate coupled to said negative power supply voltage terminal, and a drain;
  an N-channel transistor having a drain coupled to said drain of said third P-channel transistor, a gate coupled to said second terminal of said capacitor for receiving said control voltage, and a source coupled to said negative power supply voltage terminal; and
  wherein said drain of said N-channel transistor is coupled to said gate of said second P-channel transistor for providing said trigger circuit with hysteresis.

12. The charge pump of claim 11, wherein said trigger circuit further comprises buffer means having an input terminal coupled to said drain of said N-channel transistor, and an output terminal coupled to said charge pump.

13. The charge pump of claim 7, wherein said capacitor is a MOS P-channel transistor having a drain and a source coupled to said charge pump and a gate coupled to said first terminal of said switched capacitor circuit.

14. A charge pump with controlled ramp rate, comprising:
  a charge pump having a plurality of series-connected pump stages for receiving a clock signal, and in response, providing an output voltage having a magnitude greater than a magnitude of said clock signal;
  an RC differentiator circuit, comprising:
    a capacitor having a first terminal coupled to said charge pump, for receiving said output voltage, and having a second terminal for providing a control voltage proportional to a ramp-up rate of said output voltage; and
    a switched capacitor circuit having a first terminal coupled to said second terminal of said capacitor, and a second terminal coupled to a negative power supply voltage terminal, said switched capacitor circuit receiving first and second nonoverlapping clock signals, and resistively coupling said second terminal of said capacitor to said negative power supply voltage terminal; and
  a trigger circuit with hysteresis, comprising:
    load means having a first terminal coupled to a positive power supply voltage terminal, a control terminal, and a second terminal, said load means for providing a load for said trigger circuit; and a switch having a first terminal coupled to said second terminal of said load means, for providing a first second control to enable said charge pump in response to said control voltage increasing above a predetermined switching point, and providing a second control signal to disable said charge pump in response to said control voltage decreasing below said predetermined switching point, said switch having a second terminal coupled to said negative power supply voltage terminal.

15. The charge pump of claim 14, wherein said capacitor is a MOS P-channel transistor having a drain and a source coupled to said charge pump for receiving said output voltage, and a gate coupled to said first terminal of said switched capacitor circuit.

16. The charge pump of claim 14, wherein said trigger circuit comprises:

a first P-channel transistor having a source coupled to said positive power supply voltage terminal, a gate coupled to said negative power supply voltage terminal, and a drain;

a second P-channel transistor having a source coupled to said positive power supply voltage terminal, a gate, and a drain coupled to said drain of said first P-channel transistor;

a third P-channel transistor having a source coupled to said drains of said first and second P-channel transistors, a gate coupled to said negative power supply voltage terminal, and a drain;

an N-channel transistor having a drain coupled to said drain of said third P-channel transistor, a gate coupled to said second terminal of said capacitor for receiving said control voltage, and a source coupled to said negative power supply voltage terminal; and a hysteresis feedback path, coupled between said drain of said N-channel transistor and said gate of said second P-channel transistor.

17. The charge pump of claim 14, wherein said switched capacitor circuit comprising:

clock means for providing first and second nonoverlapping clock signals;

a first transistor having a first current electrode coupled to said first terminal of said capacitor, a control electrode for receiving said first nonoverlapping clock signal, and a second current electrode;

a second capacitor having a first terminal coupled to said second current electrode of said first transistor, and a second terminal coupled to said negative power supply voltage terminal; and a second transistor having a first current electrode coupled to said second current electrode of said first transistor, a second current electrode coupled to said negative power supply voltage terminal, and a control electrode for receiving said second nonoverlapping clock signal.

18. The charge pump of claim 17, wherein said clock means comprises:

a frequency divider circuit for receiving said clock signal, and in response, providing a second clock signal having a frequency that is less than a frequency of said clock signal; and a clock control logic circuit, coupled to said frequency divider circuit, for receiving said second clock signal, and providing said first and second nonoverlapping clock signals.

* * * * *